US006826739B2

(12) United States Patent
Frerichs

(10) Patent No.: US 6,826,739 B2
(45) Date of Patent: Nov. 30, 2004

(54) SYSTEM AND METHOD FOR PLACING SUBSTRATE CONTACTS IN A DATAPATH STACK IN AN INTEGRATED CIRCUIT DESIGN

(75) Inventor: Troy Horst Frerichs, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 326 days.

(21) Appl. No.: 10/144,103

(22) Filed: May 13, 2002

(65) Prior Publication Data

US 2003/0212974 A1 Nov. 13, 2003

(51) Int. Cl.[7] .............................................. G06F 17/50
(52) U.S. Cl. ............................................. 716/10; 716/9
(58) Field of Search ...................................... 716/10, 9

(56) References Cited

U.S. PATENT DOCUMENTS 6,486,546 B2 * 11/2002 Moden et al. .............. 257/686
6,490,709 B1 * 12/2002 Kimura et al. ................ 716/5

OTHER PUBLICATIONS

Ye et al., "EMI mitigation with multilayer power-bus stacks and via stitching of reference planes", IEEE Transactions on Electromagnetic Compatibility, vol. 43, No. 4, Nov. 2001, pp. 538–548.*

* cited by examiner

Primary Examiner—A. M. Thompson
Assistant Examiner—Phallaka Kik

(57) ABSTRACT

A substrate contact placement system and method are provided for the placement of substrate contacts in a datapath stack in an integrated circuit design. In accordance with one aspect of the invention, a system establishes a floorplan for the datapath stack containing a plurality of datapath macros in a netlist, and determines a placement of substrate contacts for a datapath macro in the datapath stack to minimize area used for the substrate contacts. Then, the system adds substrate contacts to the datapath stack. In accordance with another aspect of the invention, a method includes establishing a floorplan for the datapath stack containing a plurality of datapath macros in a netlist, and determining a placement of substrate contacts for a datapath macro in the datapath stack to minimize area used for the substrate contacts. Then, the substrate contacts are added to the datapath stack.

25 Claims, 6 Drawing Sheets

SYSTEM AND METHOD FOR PLACING SUBSTRATE CONTACTS IN A DATAPATH STACK IN AN INTEGRATED CIRCUIT DESIGN

BACKGROUND OF THE INVENTION

1. Field of the Invention

The present invention generally relates to computer-aided circuit design systems and more particularly to an electrical rules checker system and method for placing substrate contacts into a datapath stack in an integrated circuit design.

2. Discussion of the Related Art

Integrated circuits (ICs) are electrical circuits comprising transistors, resistors, capacitors, and other components on a single semiconductor "chip" in which the components are interconnected to perform a variety of functions. Typical examples of ICs include, for example, microprocessors, programmable logic devices (PLDs), electrically erasable programmable read only memory (EEPROM) devices, random access memory (RAM) devices, operational amplifiers and voltage regulators. A circuit designer typically designs the IC by creating a circuit schematic indicating the electrical components and their interconnections. Often, designs are simulated by computer to verify functionality and to ensure that performance goals are satisfied.

In electrical device engineering, the design and analysis work involved in producing electronic devices is often performed using electronic computer-aided design (E-CAD) tools. As will be appreciated, electronic devices include analog, digital, mixed hardware, optical, electro-mechanical, and a variety of other electrical devices. The design and subsequent simulation of any circuit, very large scale integration (VLSI) chip, or other electrical device via E-CAD tools allows a curcuit to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools utilize an electronic representation of the hardware device. A "netlist" is one common representation of a hardware device that includes the circuit. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module, which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component where the inputs, outputs, and general function are known, but the contents of which are not shown. These "black box" representations, hereinafter called "modules," will mask the complexities therein, typically showing only input/output ports.

An IC design can be represented at different levels of abstraction, such as at the register-transfer level (RTL) and the at logic level, using a hardware description language (HDL). VHDL® and Verilog® are examples of HDL languages. At any abstraction level, an IC design is specified using behavioral or structural descriptions, or a mix of both. At the logical level, the behavioral description is specified using Boolean equations. The structural description is represented as a netlist of primitive cells. Examples of primitive cells are, among others, full-adders, logic gates, latches, and flip flops.

Set forth above is some very basic information regarding integrated circuits and other circuit schematics that are represented in netlists. Systems are presently known that use the information provided in netlists to evaluate circuit timing and other related parameters. More specifically, systems are known that perform a timing analysis of circuits using netlist files. Although the operational specifics may vary from system to system, generally, such systems operate by identifying certain critical timing paths, then evaluating the circuit to determine whether timing violations may occur through the critical paths. As is known, timing specifications may be provided to such systems by way of a configuration file.

FIG. 1A is a block diagram illustrating a prior art static timing analyzer system that illustrates the basic informational flow in such a system and that is generally denoted by reference numeral 2. Specifically, one such system 2 is marketed under the name PathMill®. FIG. 1 illustrates the informational flow in system 2. At the center of the diagram is a static timing analyzer 10, (i.e., the PathMill® program). Surrounding this block 10 are a number of other blocks that represent various input and output files and/or information.

More particularly, the static timing analyzer 10 may utilize a configuration file 12, a file of timing models 14, one or more netlist files 16, a technology file 18, and a parasitics file 20, for various input information. In addition, the static timing analyzer 10 may generate a number of different output files or other output information, including a critical path report 22, a runtime log file 24, an error report 26, a software interface file 28, and a SPICE netlist 30. When started, the static timing analyzer 10 first processes the input netlist file(s) 16, the technology file 18, and the configuration files 12. The information from these files is subsequently used for performing path analyses. The function and operation of static timing analyzer 10 are generally well known, and therefore will not be discussed in detail herein.

While tools such as these are useful for the design verification process after layout, there are various shortcomings in the static timing analyzer 10, and other similar products. These shortcomings include, but are not limited to, the ability to identify appropriate locations for and place substrate contacts in a datapath stack 50 as illustrated in FIG. 1B. These substrate contacts are elements known in the art, and are needed to prevent latch-up of the circuitry.

Typically, the placing of substrate contacts in a datapath stack involves manually determining where the substrate contacts are needed and then adding them by hand. This manual addition of substrate contacts is currently extremely imprecise, time consuming, tedious and labor intensive and thus, few substrate contacts are placed manually. In addition, the manual addition of substrate contacts is very error prone due to the density and complexity of the datapath macros that are now incorporated into current integrated circuit technology. This lack of space between the datapath macros 51 is illustrated in FIG. 1B. In particular, the lack of space is illustrated between datapath macro 51B and 51C and among datapath macros 51D, 51E and 51F.

Consequently, there is a heretofore unaddressed need existing in the industry for a way to address the aforementioned deficiencies and inadequacy.

SUMMARY OF THE INVENTION

The present invention provides a substrate contact placement system and method for placing substrate contacts in a datapath stack.

Briefly described, in architecture, the substrate contact placement system can be implemented as follows. A first logic establishes a floorplan for a datapath stack containing a plurality of datapath macros in a netlist, and a second logic determines a placement of substrate contacts needed for a datapath macro in the datapath stack to minimize area needed for the substrate contacts. Then, a third logic adds substrate contacts to the datapath stack.

The invention can also be viewed as providing one or more methods for placing substrate contacts in a datapath stack. In this regard, one such method can be summarized by the following steps: (1) establishing a floorplan for the datapath stack containing a plurality of datapath macros in a netlist; (2) determining a placement of substrate contacts needed for a datapath macro in the datapath stack to minimize area needed for the substrate contacts; and (3) adding the substrate contacts to the datapath stack.

DESCRIPTION OF THE DRAWINGS

The accompanying drawings incorporated in, and forming a part of the specification, illustrate several aspects of the present invention, and together with the description serve to explain the principles of the invention. In the drawings.

Figure 3:
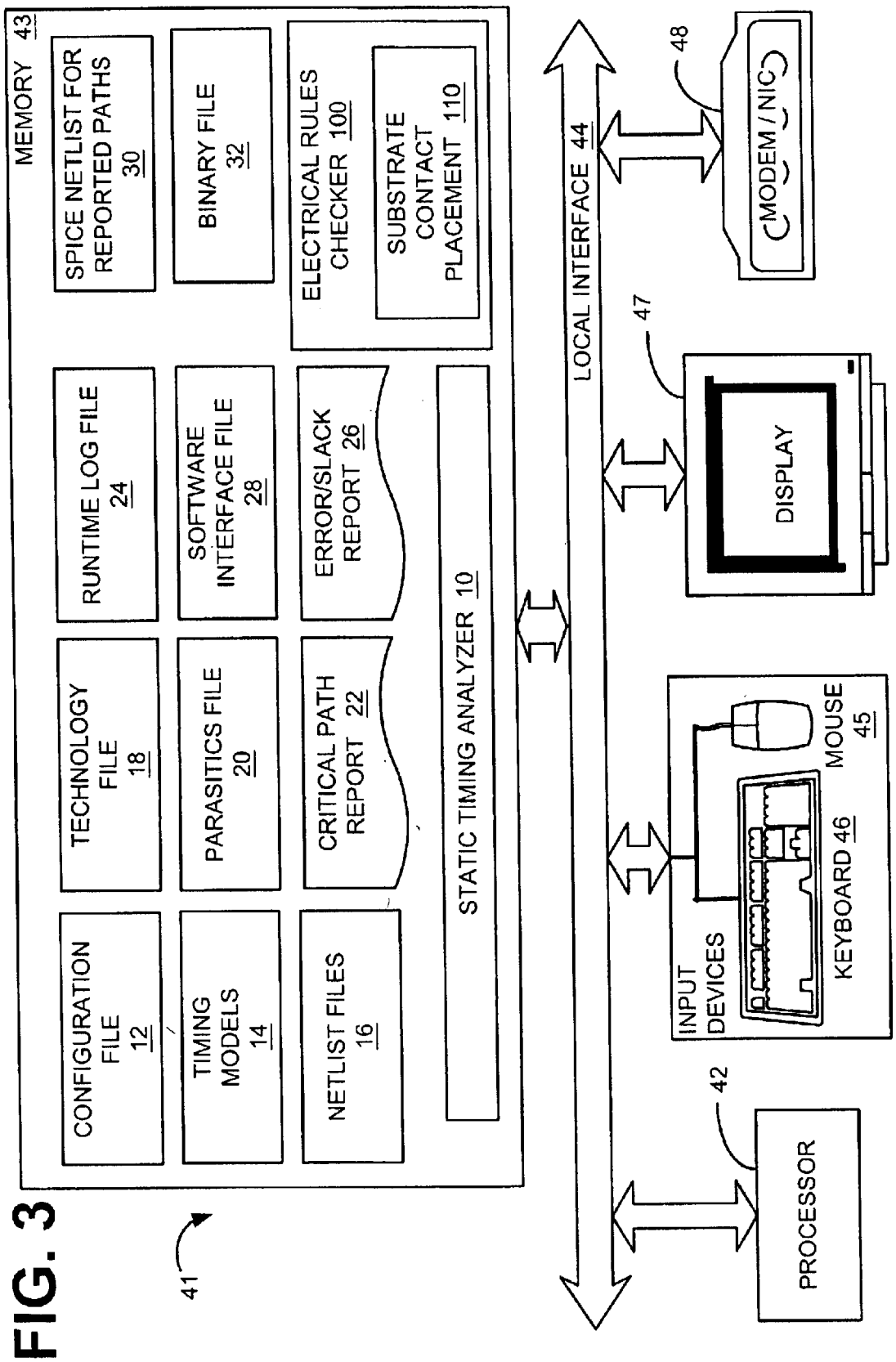
FIG. 3 is a block diagram illustrating one possible implementation of an electrical rules checker that utilizes the substrate contact placement process, situated within a computer readable medium, for example, such as in a computer system.
Figure 4:
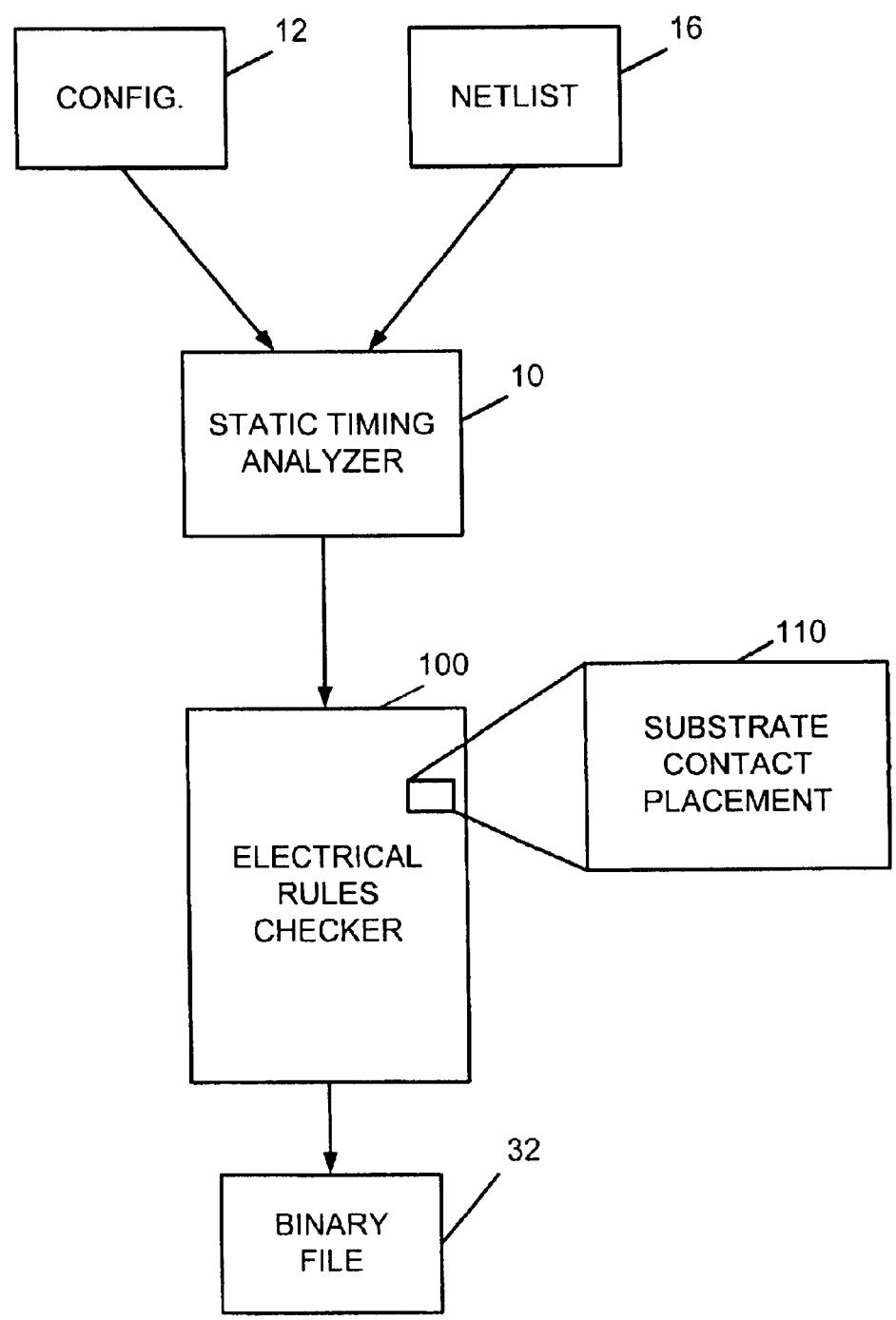
FIG. 4 is a block diagram illustrating one possible implementation of an electrical rules checker and the substrate contact placement process of the present invention, as shown in FIG. 3.
Figure 5:
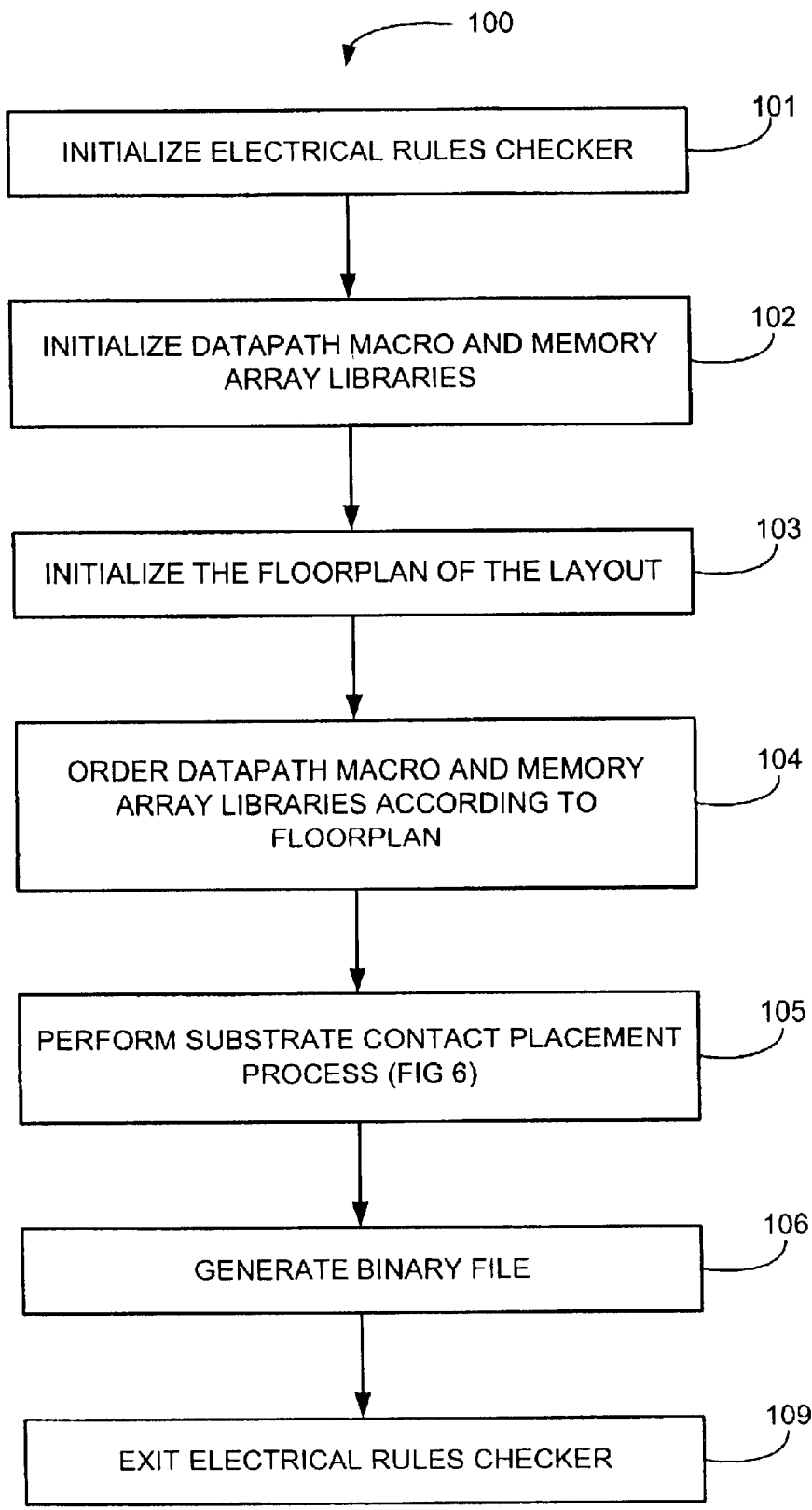

Illustrated in FIG. 5 is a flowchart depicting one possible implementation of the electrical rules checker, as shown in FIGS. 3 and 4.

Figure 6:
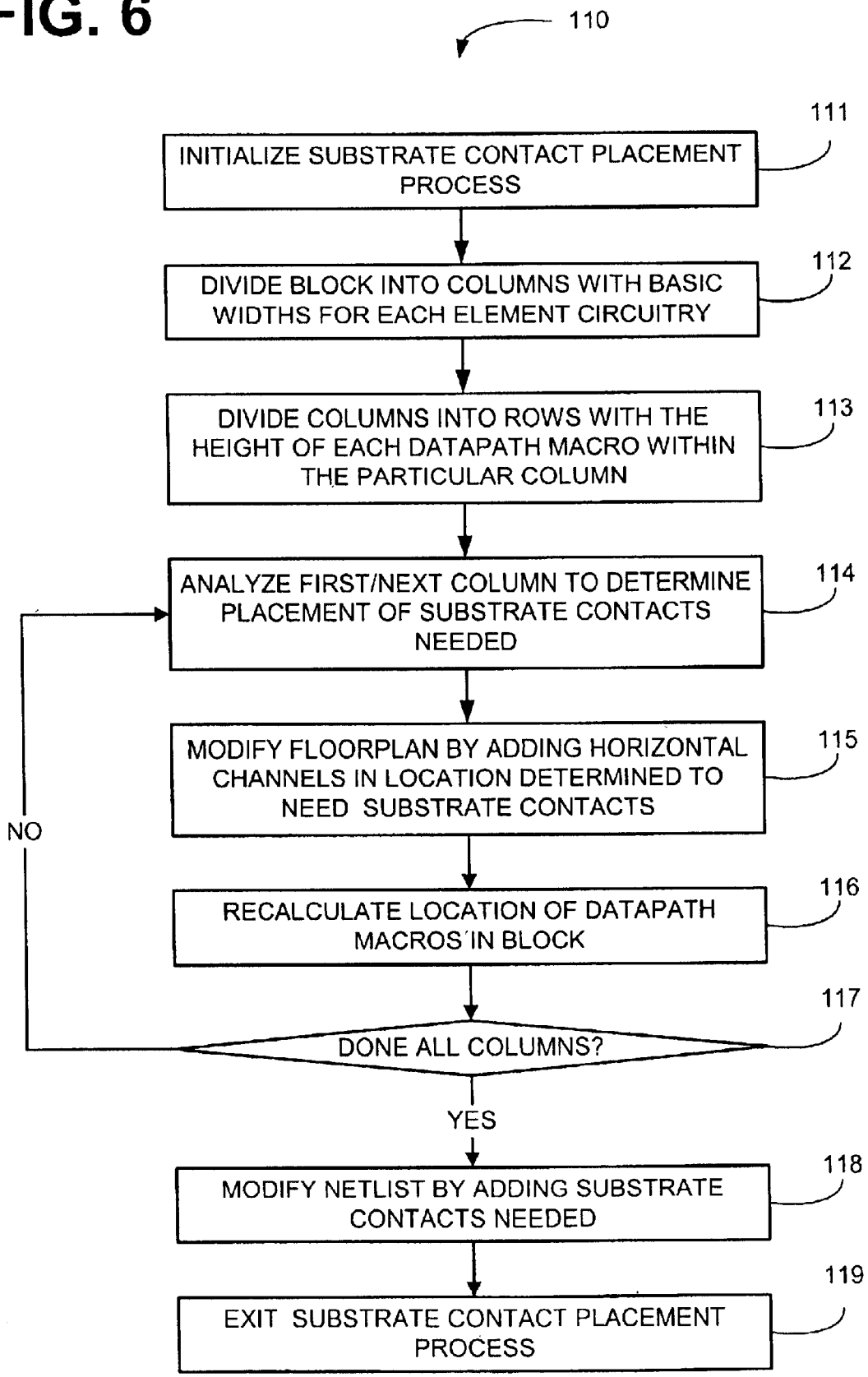

FIG. 6 is a flowchart illustrating one possible implementation of the substrate contact placement process as shown in FIGS. 3 and 4, that determines a location for substrate contacts and automatically places the substrate contacts in the netlist.

DETAILED DESCRIPTION OF THE PREFERRED EMBODIMENT

Having summarized various aspects of the present invention, the invention will now be described in detail with reference to the drawings. While the invention will be described in connection with these drawings, there is no intent to limit it to the embodiment or embodiments disclosed therein. On the contrary, the intent is to cover all alternatives, modifications and equivalents included within the spirit and scope of the invention as protected by the appended claims.

The methodology for placing substrate contacts of the present invention allows for fast, accurate and automatic placement of substrate contacts on an IC while adding minimal area to a datapath stack. As known, a datapath macro is a logical representation of logic and physical characteristics of a circuit element, and a datapath stack is a collection of datapath macros in a number of rows. The datapath stack is divided into columns of the basic cell width. The columns are then divided into rows comprising slices of overall rows. The substrate contacts need to be placed so that each datapath macro is in contact with a substrate contact that connects the datapath macro with the IC substrate. This is because any datapath macro in a column that is not touching a substrate contact or another datapath macro that is connected to a substrate contact, is electrically isolated. All datapath macros should make contact to a substrate contact within a distance specified by a design specification requirement.

In order to determine where substrate contacts are needed, the height of each of the rows is accumulated until it is determined that another substrate contact is needed. The determination is made when no datapath macro in the row is touching a substrate contact or another datapath macro that is connected to the substrate. A horizontal channel is added across an entire datapath stack where substrate contacts are needed. As each horizontal channel is added, the new position of all the datapath macros are recalculated. If a horizontal channel already exists for a substrate contact, then the cumulative height of the rows is reset and the process continues.

If a datapath macro is over a predetermined height, then the datapath macro is assumed to already have substrate contacts connected to it within a specified distance. If needed, a horizontal channel can be added above or below the datapath macro. Once all the columns are traversed and there are no more horizontal channels that need to be added, then the method of placing substrate contacts onto datapath stack is completed.

Figure 2:
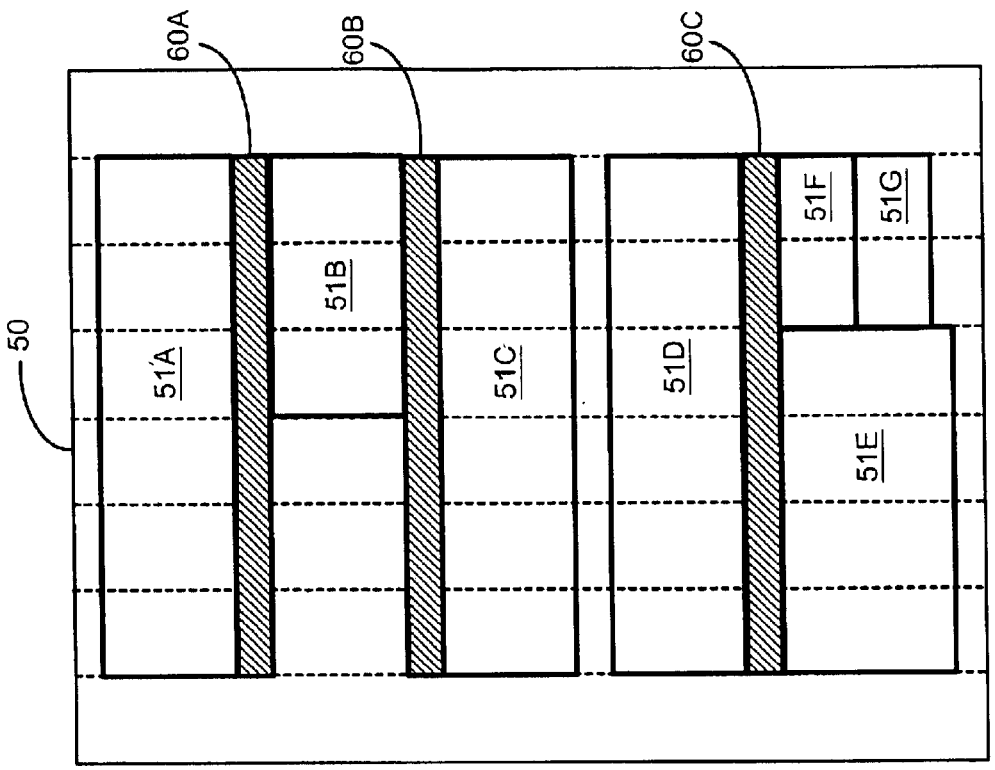
FIG. 2 is a block diagram illustrating one possible implementation of placing substrate contacts on a datapath stack containing a number of datapath macros, as provided by the substrate contact placement process of the present invention.

FIG. 2 is a block diagram illustrating one possible implementation of placing substrate contacts on a datapath stack 50 containing a number of datapath macros 51A–51G, as provided by the substrate contact placement process of the present invention. As shown, the datapath stack 50 includes the datapath macros 51A–51G and horizontal channels 60A–60C provide a location for the placement of substrate contacts. By determining the appropriate locations of substrate contacts, a horizontal channel can be allocated by shifting the appropriate datapath macro. Once all the horizontal channels 60A–60C are added to satisfy the demand for substrate contacts, the substrate contacts can be added in the horizontal channels 60A–60C.

Utilizing the methodology of the present invention for placing substrate contacts onto datapath stacks provides for fast, accurate, and automatic placement of substrate contacts while minimizing any additional area required for the placement of the substrate contacts. It is understood that the datapath stack 50 with datapath macros 51A–51G is illustrated in the vertical plane, and that if the datapath stack 50 with datapath macros 51A–51G were in a horizontal plane, then the horizontal channels 60A–60C for the substrate contacts would be in the vertical plane.

As shown in FIG. 2, each datapath macro 51A–51G is connected to a horizontal channel 60 containing substrate contacts. The datapath macros 51 need not be in immediate contact with a horizontal channel 60, they only need be indirectly connected to a horizontal channel 60 containing a substrate contact. As shown, datapath macro 51G is not in direct contact with a horizontal channel 60C containing substrate contacts. However, datapath macro 51G is in indirect contact with horizontal channel 60C via datapath macro 51F, which does have space allocated for the placement of substrate contacts.

FIG. 3 is a block diagram illustrating one possible implementation of an electrical rules checker 100 that utilizes the substrate contact placement process 110 of the present invention, situated within a computer readable medium, such as, for example, a memory 43 in a general-purpose computer system 41. A general-purpose computer system 41 can identify, access, and process resources desired by a user.

Generally, in terms of hardware architecture, as shown in FIG. 3, the computer system 41 includes a processor 42, memory 43, and one or more input devices and/or output (I/O) devices (or peripherals) that are communicatively coupled via a local interface 44. The local interface 44 can be, for example, but not limited to, one or more buses or other wired or wireless connections, as is known in the art. The local interface 44 may have additional elements, which are omitted for simplicity, such as controllers, buffers (caches), drivers, repeaters, and receivers, to enable communications. Further, the local interface 44 may include address, control, and/or data connections to enable appropriate communications among the aforementioned components.

The processor 42 is a hardware device for executing software that can be stored in memory 43. The processor 42 can be any custom made or commercially available processor, a central processing unit (CPU) or an auxiliary processor among several processors associated with the computer system 41, and a semiconductor based microprocessor (in the form of a microchip) or a macroprocessor. Examples of suitable commercially available microprocessors are as follows: an 80×86 or Pentium series microprocessor from Intel Corporation, U.S.A., a PowerPC microprocessor from IBM, U.S.A., a Sparc microprocessor from Sun Microsystems, Inc, a PA-RISC series microprocessor from Hewlett-Packard Company, U.S.A., or a 68xxx series microprocessor from Motorola Corporation, U.S.A.

The memory 43 can include any one or combination of volatile memory elements (e.g., random access memory (RAM, such as DRAM, SRAM, etc.)) and nonvolatile memory elements (e.g., ROM, hard drive, tape, CDROM, etc.). Moreover, the memory 43 may incorporate electronic, magnetic, optical, and/or other types of storage media. Note that the memory 43 can have a distributed architecture, where various components are situated remote from one another, but can be accessed by the processor 42.

The software in memory 43 may include one or more separate programs, each of which comprises an ordered listing of executable instructions for implementing logical functions. In the example of FIG. 3, the software in the memory 43 includes an operating system (not shown), configuration file 12, file of timing models 14, one or more netlist files 16, technology file 18, and a parasitics file 20, containing various input information. The critical path report 22, runtime log file 24, error report 26, software interface file 28, SPICE (i.e., a circuit simulator) netlist 30, and binary file 106 output files or other output information are also situated in memory 43. The substrate contact placement process 110 to place substrate contacts in a datapath stack is herein defined in further detail with regard to FIGS. 4–6.

A non-exhaustive list of examples of suitable commercially available operating systems is as follows: a Windows operating system from Microsoft Corporation, U.S.A., a Netware operating system available from Novell, Inc., U.S.A., an operating system available from IBM, Inc., U.S.A., any LINUX operating system available from many vendors or a UNIX operating system, which is available for purchase from many vendors, such as Hewlett-Packard Company, U.S.A., Sun Microsystems, Inc. and AT&T Corporation, U.S.A. The operating system essentially controls the execution of other computer programs, such as the electrical rules checker 100 and the substrate contact placement process 110, and provides scheduling, input-output control, file and data management, memory management, and communication control and related services.

The electrical rules checker 100 that utilizes substrate contact placement process 110 may be a source program, executable program (object code), script, or any other entity comprising a set of instructions to be performed. When a source program, then the program is usually translated via a compiler, assembler, interpreter, or the like, which may or may not be included within the memory 43, so as to operate properly in connection with the O/S. Furthermore, the electrical rules checker 100 that utilizes substrate contact placement process 110 can be written as (a) an object oriented programming language, which has classes of data and methods, or (b) a procedure programming language, which has routines, subroutines, and/or functions, for example but not limited to, C, C++, Pascal, BASIC, FORTRAN, COBOL, Perl, Java, and Ada.

The I/O devices may include input devices, for example but not limited to, a keyboard 46, mouse 45, scanner, microphone, etc. Furthermore, the VO devices may also include output devices, for example but not limited to, a printer, display 47, etc. Finally, the I/O devices may further include devices that communicate both inputs and outputs, for instance but not limited to, a modulator/demodulator (modem; for accessing another device, system, or network) 48, a radio frequency (RF) or other transceiver, a telephonic interface, a bridge, a router, etc.

If the computer system 41 is a PC, workstation, or the like, the software in the memory 43 may further include a basic input output system (BIOS) (omitted for simplicity). The BIOS is a set of essential software routines that initialize and test hardware at startup, start-up the O/S, and support the transfer of data among the hardware devices. The BIOS is stored in ROM so that the BIOS can be executed when the computer system 41 is activated.

When the computer system 41 is in operation, the processor 42 is configured to execute software stored within the memory 43, to communicate data to and from the memory 43, and to generally control operations of the computer system 41 pursuant to the software. The electrical rules checker 100 that utilizes substrate contact placement process 110 and the O/S are read, in whole or in part, by the processor 42, perhaps buffered within the processor 42, and then executed.

The electrical rules checker 100 and substrate contact placement process 110 can be implemented in hardware, software, firmware or a combination thereof. In the preferred embodiment, the electrical rules checker 100 and the substrate contact placement process 110 are implemented in software or firmware that is stored in a memory, such as the memory 43, and that is executed by a suitable instruction execution system, such as processor 42.

Having set forth the basic and probable circuit configurations of the various structures identified by the method of the present invention, reference is now made to FIGS. 4–6, which collectively comprise a block diagram and flow charts that illustrate the top-level functional operation of the electrical rules checker 100 and substrate contact placement process 110 in accordance with the preferred embodiment of the present invention.

Figure 1A:
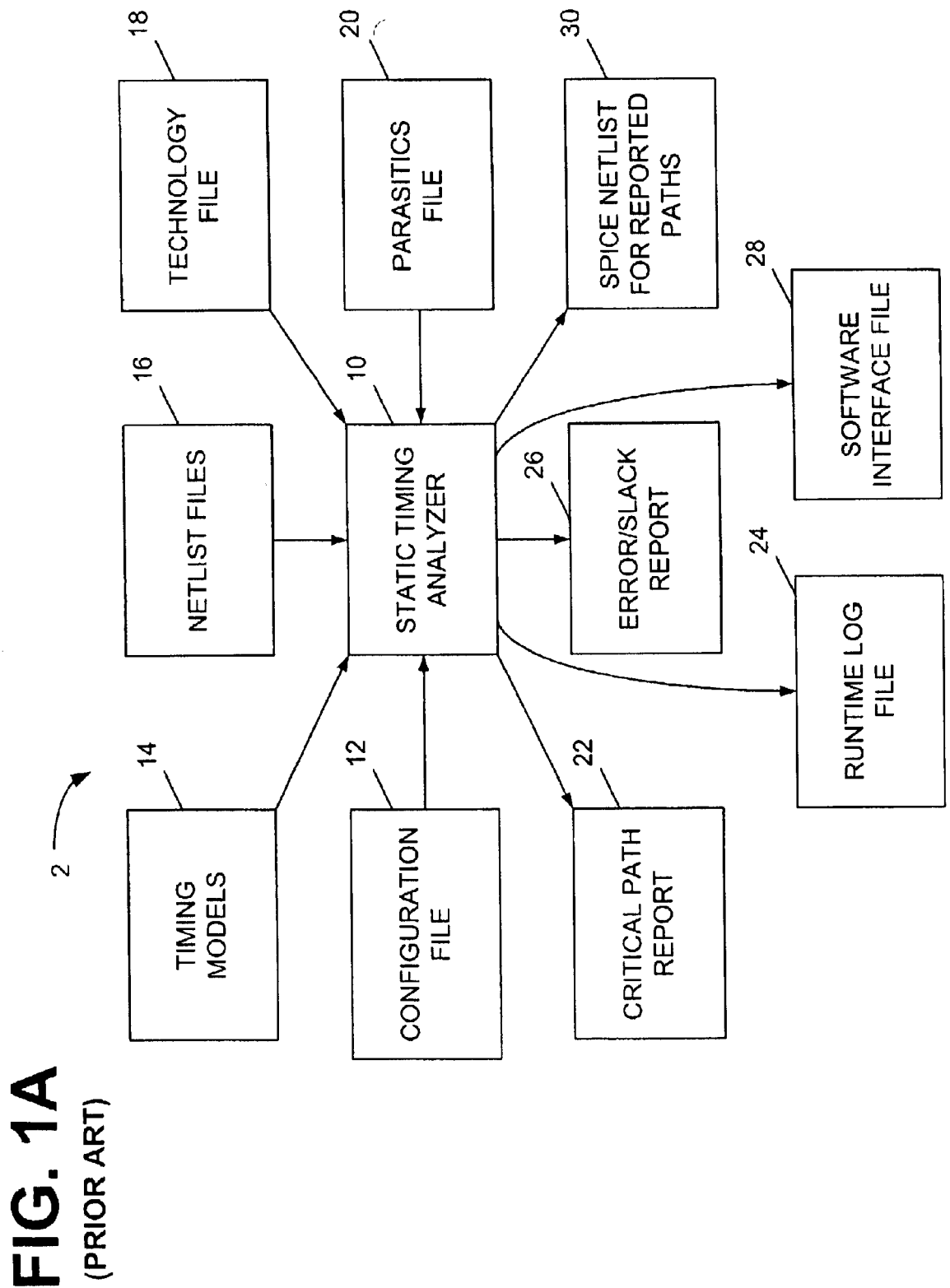
FIG. 1A is a block diagram of a static timing analyzer system, as is known in the prior art.
Figure 1B:
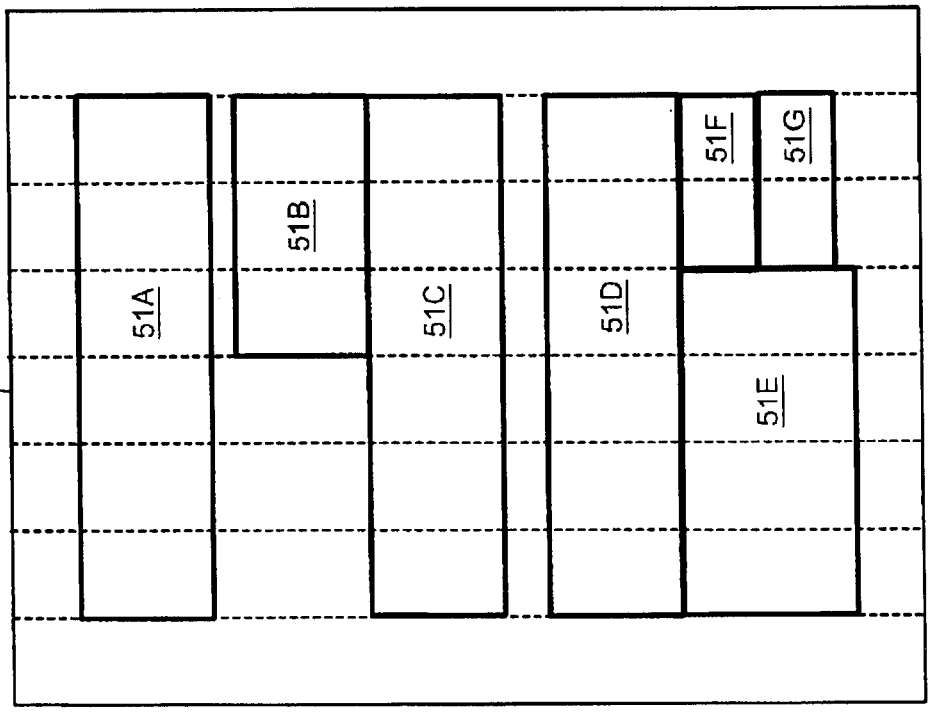
FIG. 1B is a block diagram of a datapath stack containing a number of datapath macros, as known in the prior art.

FIG. 4 is a block diagram illustrating one possible implementation of an electrical rules checker 100 and the substrate contact placement process 110 of the present invention, as shown in FIG. 3. In the illustrated embodiment, only the static timing analyzer 10, the configuration file 12, and the netlist file 16 from FIG. 1 are shown. The configuration file 12 contains information that enables the static timing analyzer 10 to perform its analysis, and various numbers of configuration files may be used. The netlist file 16, as is well known, defines the various integrated circuit components, and their connection and inter-relations. The static timing analyzer 10 may make available to the electrical rules checker 100 an output binary file 106.

The electrical rules checker 100 preferably is configured to operate on an output of the static timing analyzer 10. In this regard, the static timing analyzer may be configured to generate other netlist files 16, which the electrical rules checker 100 utilizes as an input. An electrical rules checker 100 performs various checks over certain rules or strategies in an integrated circuit design. Such rules may vary from circuit to circuit, depending upon the particular application.

The electrical rules checker 100 includes the preferred embodiment of the present invention, and operates to provide a method for placing substrate contacts in a datapath stack. Customarily, datapath stacks are constructed very compactly so placing a substrate contact adjoining a datapath macro is not always feasible. Utilizing a horizontal channel placed in the datapath stack adjoining a datapath macro needing substrate contacts provide several advantages. First, there is an efficient and accurate placement of substrate contacts on datapath macros needing substrate contacts. Next, these substrate contacts are added in a horizontal channel that minimizes the area used. Once the horizontal channels are utilized, then it is possible to place the substrate contacts in the appropriate locations.

FIG. 5 is a flowchart illustrating one possible implementation of the electrical rules checker 100, as shown in FIGS. 3 and 4. An electrical rules checker 100 may perform various checks over certain rules or strategies in an integrated circuit design. Such rules may vary from circuit to circuit, depending upon the particular application.

First, the electrical rules checker initializes step 101. At step 102, the electrical rules checker 100 initializes the datapath macro and memory array libraries. Next, at step 103, the electrical rules checker 100 initializes the floorplan of the current circuit layout. Next, ordering of the datapath macro and memory array libraries is performed according to the floorplan at step 104. At step 105, the electrical rules checker 100 performs the substrate contact placement process, herein defined in further detail with regard to FIG. 6. At step 106, the electrical rules checker 100 generates binary file 32, and exits at step 109.

FIG. 6 is a flowchart illustrating one possible implementation of the substrate contact placement process as shown in FIGS. 3 and 4, that determines a location for substrate contacts and automatically places the substrate contacts in the netlist. The substrate contact placement process 110 allows for fast, accurate and automatic placement of substrate contacts on an integrated circuit while adding minimal area to a datapath stack.

A datapath stack contains a number of rows of datapath macros. The datapath stack is divided into columns of the basic cell width. The columns are then divided into rows comprising slices of overall rows. The substrate contacts should be placed so that each datapath macro is in contact with a substrate contact. Any portion of a datapath macro in a column that is not touching a substrate contact or another datapath macro connected to the substrate, is isolated. All datapath macros should have contact with a substrate contact within a predetermined distance defined by a design specification.

In order to determine where substrate contacts are needed, the height of the rows are accumulated until it is determined that another substrate contact is needed. The horizontal channel 60 (FIG. 2) is added and the process is continued for each column. Horizontal channels 60 are added across an entire datapath stack where substrate contacts are needed. As each horizontal channel 60 is added, the new positions of all the datapath macros 51 (FIG. 2) are recalculated. If a horizontal channel already exists for a substrate contact, then the cumulative height is reset and the substrate contact placement process 110 continues. Also, if a datapath macro 51 is over a predetermined height, then it is assumed to have already had substrate contacts connected to it within a specified distance. If needed, a horizontal channel 60 can be added below the datapath macro 51 and the substrate contact placement process 110 continues. Once all the columns are traversed and there are no more horizontal channels that need to be added, then the substrate contact placement process 110 for placing substrate contacts onto datapath stack 50 is completed.

As shown in FIG. 6, the substrate contact placement process 110 initializes at step 111. At step 112, the substrate contact placement process 110 divides the datapath stack 50 (FIG. 2), into columns with each of the columns being divided into basic widths. At step 113, each of the columns is divided into rows with the height of each datapath macro within that particular column. At step 114, the substrate contact placement process 110 analyzes a column to determine the location at which substrate contacts are needed. The floorplan is modified by adding the horizontal channels in locations determined to need substrate contacts, at step 115. At step 116, the substrate contact placement process 110 recalculates the location of the datapath macros 51 (FIG. 2) within the datapath stack 50 (FIG. 2).

At step 117, the substrate contact placement process 110 determines if all the columns have been analyzed. If it is determined at step 117 that all of the columns have not been analyzed, then the substrate contact placement process 110 returns to repeat steps 114–117. However, if it is determined at step 117 that all of the columns in the datapath stack 50 have been analyzed, then the substrate contact placement process 110 modifies the netlist files 16 (FIG. 2) by adding substrate contacts in all of the horizontal channels where the substrate contacts are needed at step 118. The substrate contacts are placed in compliance with physical IC design rules. The substrate contact placement process 110 then exits at step 119.

Having described the method of the present invention, it will be appreciated that the steps illustrated in the flow charts of FIGS. 5 and 6 are provided for purposes of illustration and are not deemed to be limiting on the broader aspects of the present invention. Indeed, the broader aspects of the present invention may be implemented using a variety of different approaches that are still consistent with the scope and content of the present invention.

It should be appreciated that the flow charts of FIGS. 5 and 6 show the top-level operation of only one possible implementation of the methods of the present invention. In this regard, when implemented in software or firmware, as in the case of the preferred embodiment, each block represents a module, segment, or portion of code, which comprises one or more executable instructions for implementing the specified logical function(s). It should also be noted that in some alternative implementations, the functions noted in the blocks might occur out of the order. For example, two blocks shown in succession may in fact be executed substantially concurrently or the blocks may sometimes be executed in the reverse order, depending upon the functionality involved.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for placing substrate contacts in a datapath stack comprising the steps of:
    establishing a floorplan for the datapath stack containing a plurality of datapath macros in a netlist;
    determining a placement of substrate contacts needed for a datapath macro in the datapath stack to minimize area used for the substrate contacts; and
    adding substrate contacts to the datapath stack.

2. The method as defined in claim 1, further comprising:
    determining a location of the datapath macro in the floorplan in the netlist.

3. The method as defined in claim 1, wherein the step of determining the placement of substrate contacts further comprises:
    dividing the datapath stack into at least one column; and
    dividing the datapath stack into at least one row.

4. The method as defined in claim 3, wherein the step of determining the placement of substrate contacts further comprises:
    dividing the at least one column into basic widths.

5. The method as defined in claim 1, wherein the step of determining the placement of substrate contacts further comprises:
    adding at least one horizontal channel for the substrate contacts to be added in the datapath stack if the substrate contacts are needed.

6. A system for placing substrate contacts in a datapath stack comprising:
    means for establishing a floorplan for the datapath stack containing a plurality of datapath macros in a netlist;
    means for determining a placement of substrate contacts needed for a datapath macro in the datapath stack to minimize area used for the substrate contacts; and
    means for adding substrate contacts to the datapath stack.

7. The system of claim 6, further comprising:
    means for determining a location of the datapath macro in the floorplan in the netlist.

8. The system of claim 6, further comprising:
    means for dividing the datapath stack into at least one column; and
    means for dividing the datapath stack into at least one row.

9. The system of claim 8, further comprising:
    means for dividing the at least one column into basic widths.

10. The system of claim 6, further comprising:
    means for adding at least one horizontal channel for the substrate contacts to be added in the datapath stack if the substrate contacts are needed.

11. A computer readable storage medium containing program code for placing substrate contacts in a datapath stack comprising:
    a first code segment configured to establish a floorplan for the datapath stack containing a plurality of datapath macros in a netlist;
    a second code segment configured to determine a placement of substrate contacts needed for a datapath macro in the datapath stack to minimize area used for the substrate contacts; and
    a third code segment configured to add substrate contacts to the datapath stack.

12. The computer readable storage medium of claim 11, said program code further comprising:
    a fourth code segment configured to calculate a location of the datapath macros in the floorplan in the netlist.

13. The computer readable storage medium of claim 11, wherein said second code segment is further configured to divide the datapath stack into at least one column, and divide the datapath stack into at least one row.

14. The computer readable storage medium of claim 13, wherein said second code segment is further configured to divide the at least one column into basic widths.

15. The computer readable storage medium of claim 11, wherein said second code segment is further configured to add at least one horizontal channel for the substrate contacts to be added in the datapath stack if the substrate contacts are needed.

16. A contact placement system for placing substrate contacts in a datapath stack comprising:
    logic that establishes a floorplan for the datapath stack containing a plurality of datapath macros in a netlist;
    logic that determines a placement of substrate contacts needed for a datapath macro in the datapath stack to minimize area used for the substrate contacts; and
    logic that adds substrate contacts to the datapath stack.

17. The contact placement system of claim 16, further comprising:
    logic that calculates a location of the datapath macro in the floorplan in the netlist.

18. The contact placement system of claim 16, further comprising:
    logic that divides the datapath stack into at least one column; and
    logic that divides the datapath stack into at least one row.

19. The contact placement system of claim 18, further comprising:
    logic that divides the at least one column into basic widths.

20. The contact placement system of claim 16, further comprising:
    logic that adds at least one horizontal channel for the substrate contacts to be added in the datapath stack if the substrate contacts are needed.

21. A circuitry having substrate contacts constructed by a method comprising:
    establishing a floorplan for the datapath stack containing a plurality of datapath macros in a netlist;
    determining a placement of substrate contacts needed for a datapath macro in the datapath stack to minimize area used for the substrate contacts; and
    adding substrate contacts to the datapath stack.

22. The circuitry as defined in claim 21, said method further comprising:

calculating a location of the datapath macro in the floorplan in the netlist.

23. The circuitry as defined in claim 21, said method further comprising:

dividing the datapath stack into at least one column; and dividing the datapath stack into at least one row.

24. The circuitry as defined in claim 23, said method further comprising:

dividing the at least one column into basic widths for each element circuitry.

25. The circuitry as defined in claim 21, said method further comprising:

adding at least one horizontal channel for the substrate contacts to be added in the datapath stack if the substrate contacts are needed.

* * * * *